(12) United States Patent
Aichi

(10) Patent No.: US 7,486,378 B2
(45) Date of Patent: Feb. 3, 2009

(54) EXPOSURE APPARATUS

(75) Inventor: Shintaro Aichi, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 240 days.

(21) Appl. No.: 11/468,524

(22) Filed: Aug. 30, 2006

(65) Prior Publication Data

US 2007/0046911 A1 Mar. 1, 2007

(30) Foreign Application Priority Data

Aug. 30, 2005 (JP) .............................. 2005-249942

(51) Int. Cl.
*G03B 27/52* (2006.01)
*G03B 27/42* (2006.01)
(52) U.S. Cl. .......................................... 355/30; 355/53
(58) Field of Classification Search ................. 355/30, 355/53
See application file for complete search history.

(56) References Cited

U.S. PATENT DOCUMENTS

| 4,720,732 | A | * | 1/1988 | Tsutsui ......................... 355/30 |
| 4,814,625 | A | * | 3/1989 | Yabu ............................ 250/548 |
| 5,969,441 | A | | 10/1999 | Loopstra et al. ................ 310/12 |
| 6,638,672 | B2 | * | 10/2003 | Deguchi ........................ 430/30 |
| 6,778,258 | B2 | * | 8/2004 | del Puerto et al. .............. 355/72 |
| 6,987,554 | B2 | * | 1/2006 | Nomoto ........................ 355/53 |
| 2005/0110968 | A1 | | 5/2005 | Aichi et al. .................... 355/30 |

FOREIGN PATENT DOCUMENTS

JP 2000-505958 5/2000

* cited by examiner

*Primary Examiner*—Diane I Lee
*Assistant Examiner*—Steven H Whitesell-Gordon
(74) *Attorney, Agent, or Firm*—Fitzpatrick, Cella, Harper & Scinto

(57) ABSTRACT

An exposure apparatus includes an alignment station where an alignment measurement process is executed, an exposure station where an exposure process is executed, and two stages, which can be swapped between the alignment station and the exposure station. A first blowing unit blows temperature-adjusted gas toward the alignment station, a second blowing unit blows temperature-adjusted gas toward the exposure station, and an air curtain unit forms an air curtain between the alignment station and the exposure station. The air curtain unit includes a third blowing unit which is arranged between the alignment station and the exposure station and blows gas so as to form an air curtain to partition the alignment station and the exposure station, and a third temperature adjusting unit supplies temperature-adjusted gas to the third blowing unit.

14 Claims, 5 Drawing Sheets

EXPOSURE APPARATUS

This application claims the benefit of Japanese Patent Application No. 2005-249942, filed on Aug. 30, 2005, which is hereby incorporated by reference herein in its entirety.

BACKGROUND OF THE INVENTION

1. Field of the Invention

The present invention relates to an exposure apparatus and, more particularly, to an exposure apparatus comprising two stages, which can be swapped between an alignment station and an exposure station.

2. Description of the Related Art

In recent years, to improve the processing capability of an exposure apparatus, such as a semiconductor exposure apparatus, a high-speed positioning apparatus, such as an original stage device or a substrate stage device has been under development. In this positioning apparatus, the amount of heat generated by an actuator which drives a stage increases. The temperature of the optical path of a laser interferometer to align the stage fluctuates due to this heat generation. The dimensions of members involved vary due to the heat generation as well. These phenomena degrade the position measurement accuracy, as well as the positioning accuracy.

Japanese Patent Application Laid-Open No. 2000-505958 discloses an exposure apparatus comprising two stages, which can be swapped between an exposure station and an alignment station. The exposure apparatus described in Japanese Patent Application Laid-Open No. 2000-505958 can execute an exposure process in the exposure station and an alignment measurement process in the alignment station in parallel.

In an exposure apparatus which executes an exposure process in an exposure station and an alignment measurement process in an alignment station in parallel, when temperature adjusting gas is supplied from the exposure station to the alignment station, the alignment accuracy may degrade. The same applies to a case wherein the direction in which the temperature adjusting gas is supplied is reversed.

For example, assume that temperature-adjusted gas adjusts the temperature of a stage positioned in a measurement processing area in an alignment station after adjusting the temperature of a stage positioned in an exposure processing area in an exposure station. In this case, the temperature-adjusted gas flows into the measurement processing area after removing heat in the exposure processing area. This locally generates temperature non-uniformity or a temperature gradient in the measurement processing area. Therefore, the alignment measurement accuracy degrades in response to a variation in a dimension of a wafer, a wafer chuck, or a stage in the measurement processing area, or a variation in temperature of the optical path for position measurement. As a result, the alignment accuracy degrades. If the dimension or shape of the wafer in alignment is different from that in exposure, the alignment accuracy degrades as well.

SUMMARY OF THE INVENTION

The present invention has been made in consideration of the above problems, and has as its object, e.g., to execute an alignment measurement process and exposure process in exactly temperature-controlled environments in an exposure apparatus comprising two stages, which can be swapped between an alignment station and an exposure station.

According to a first aspect of the present invention, there is provided an exposure apparatus, which includes an alignment station, in which an alignment measurement process is executed, an exposure station where an exposure process is executed, and two stages, which can be swapped between the alignment station and the exposure station, comprising a first blowing unit which blows temperature-adjusted gas toward the alignment station, and a second blowing unit which blows temperature-adjusted gas toward the exposure station, wherein directions in which the first blowing unit and the second blowing unit blow the gases are substantially perpendicular to a direction along which the alignment station and the exposure station are arranged.

According to a preferred embodiment of the present invention, the exposure apparatus further comprises a first temperature sensor, which measures the temperature of the gas blown from the first blowing unit, a second temperature sensor which measures the temperature of the gas blown from the second blowing unit, a first temperature adjusting unit which supplies, to the first blowing unit, the gas that is temperature-adjusted in accordance with the temperature measurement result sent from the first temperature sensor, and a second temperature adjusting unit which supplies, to the second blowing unit, the gas that is temperature-adjusted in accordance with the temperature measurement result sent from the second temperature sensor.

According to a preferred embodiment of the present invention, the direction in which the first blowing unit and the second blowing unit blow the gases can be a substantially horizontal direction.

Alternatively, according to another embodiment of the present invention, the direction in which the first blowing unit and the second blowing unit blow the gases can be a substantially vertical direction.

According to a preferred embodiment of the present invention, the exposure apparatus may further comprise an air curtain unit, which forms an air curtain between the alignment station and the exposure station.

According to a second aspect of the present invention, there is provided an exposure apparatus which includes an alignment station where an alignment measurement process is executed, an exposure station where an exposure process is executed, and two stages which can be swapped between the alignment station and the exposure station, the apparatus comprising a first blowing unit which blows temperature-adjusted gas toward the alignment station, a second blowing unit, which blows temperature-adjusted gas toward the exposure station, and an air curtain unit, which forms an air curtain between the alignment station and the exposure station.

According to a preferred embodiment of the present invention, the air curtain unit preferably includes a third blowing unit, which is arranged between the alignment station and the exposure station and blows gas so as to form an air curtain to partition the alignment station and the exposure station.

According to a preferred embodiment of the present invention, the air curtain unit preferably further includes a third temperature adjusting unit which supplies temperature-adjusted gas to the third blowing unit.

According to a preferred embodiment of the present invention, the air curtain unit preferably further includes a suction unit which draws gas by suction.

According to a preferred embodiment of the present invention, the third blowing unit preferably sprays gas substantially vertically downward to form a downflow.

According to a third aspect of the present invention, there is provided an exposure apparatus, which includes an alignment station, in which an alignment process is executed, an exposure station where an exposure process is executed, and two stages, which can be swapped between the alignment station and the exposure station, comprising an air curtain unit which forms an air curtain between the alignment station and the exposure station.

According to a fourth aspect of the present invention, there is provided a device manufacturing method comprising steps of causing any one of the above-described exposure apparatuses to form a latent image pattern on a photosensitive agent applied to a substrate, and developing the latent image pattern.

According to the present invention, for example, an alignment measurement process and an exposure process can be executed in exactly temperature-controlled environments in an exposure apparatus comprising two stages, which can be swapped between an alignment station and an exposure station.

Further features of the present invention will become apparent from the following description of exemplary embodiments, with reference to the attached drawings.

DESCRIPTION OF THE PREFERRED EMBODIMENTS

Preferred embodiments of the present invention will be described below with reference to the accompanying drawings.

First Embodiment

Figure 1:
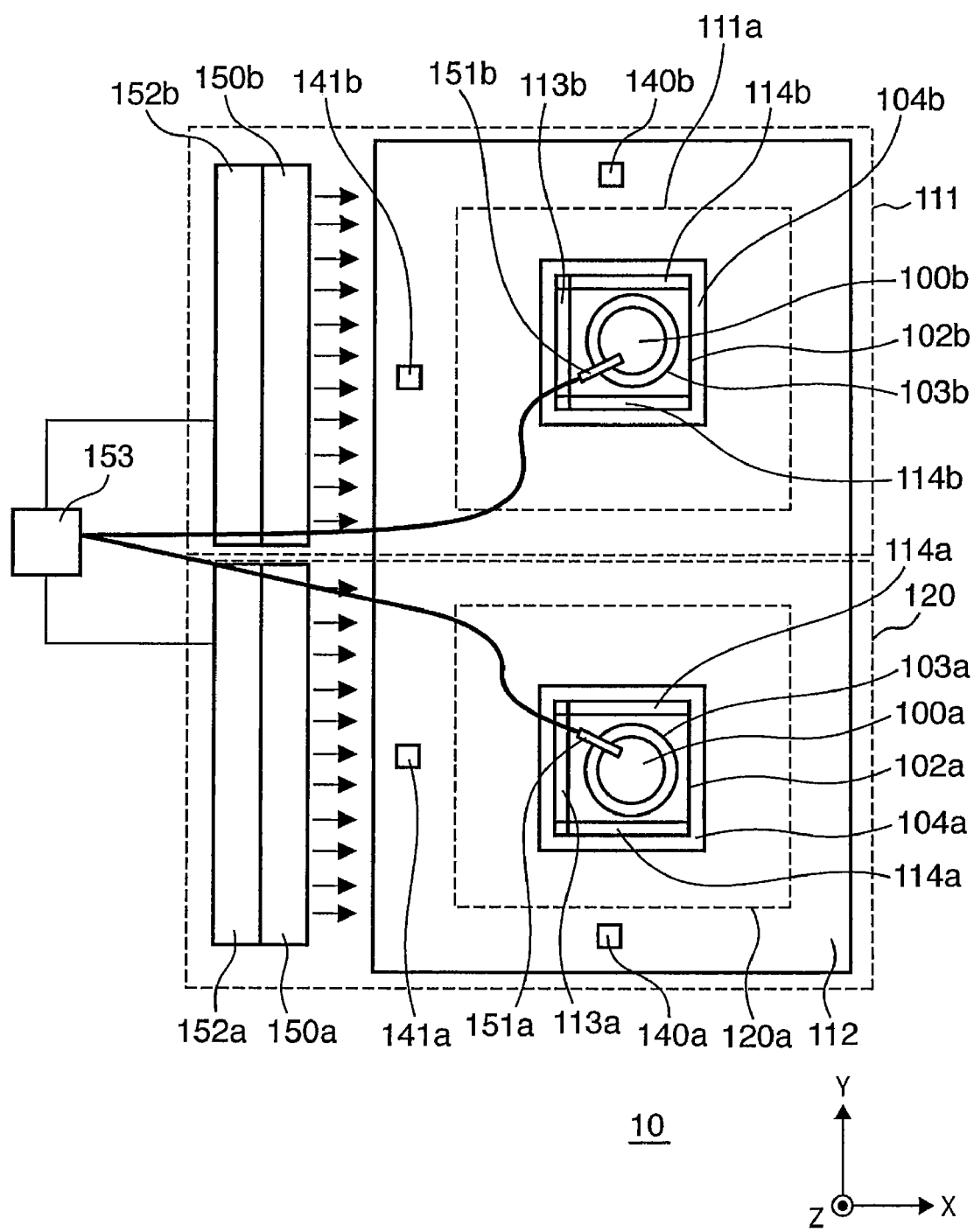
FIG. 1 is a schematic view showing an exposure apparatus according to the first embodiment of the present invention.

FIG. 1 is a plan view showing the schematic structure of an exposure apparatus according to the first embodiment of the present invention. An exposure apparatus 10, shown in FIG. 1, comprises an exposure station 111 and an alignment station 120. The exposure station 111 and alignment station 120 share a stage surface plate 112, which provides a reference surface. The exposure apparatus 10 comprises stages 104a and 104b movable in the X and Y directions on the stage surface plate 112. The exposure apparatus 10 may comprise a larger number of stages movable in the X and Y directions on the stage surface plate 112.

An alignment unit, including an alignment optical system, is arranged in the alignment station 120 and executes a measurement process for measuring the position of an alignment mark on a wafer. An exposure unit, including a projection optical system, is arranged in the exposure station 111 and transfers the pattern of an original (reticle) onto a photosensitive agent applied to the wafer. In this transfer, the wafer is aligned in accordance with the result of the measurement process executed in the alignment station 120.

The stages 104a and 104b can be swapped between the exposure station 111 and the alignment station 120. For example, an alignment measurement process is executed using the stage 104a in the alignment station 120 in parallel to execution of an exposure process using the stage 104b in the exposure station 111. After these processes are completed, the stages 104a and 104b can be moved to the exposure station 111 and alignment station 120, respectively. The wafer mounted on the stage 104a, which has moved from the alignment station 120 to the exposure station 111, has already undergone the alignment measurement process in the alignment station 120. This makes it possible to execute the exposure process on the basis of that measurement process result, while aligning the wafer.

Fine moving stages 102a and 102b are mounted on the stages 104a and 104b, respectively. Wafer chucks 103a and 103b are mounted on the fine moving stages 102a and 102b, respectively. In FIG. 1, wafers 100a and 100b are held by the wafer chucks 103a and 103b, respectively. The fine moving stage 102a comprises an X mirror 113a and two Y mirrors 114a. The X mirror 113a measures the position of the fine moving stage 102a (wafer) along the X direction. The Y mirrors 114a measure the position of the fine moving stage 102a (wafer) along the Y direction. Similarly, the fine moving stage 102b comprises an X mirror 113b and two Y mirrors 114b. The X mirror 113b measures the position of the fine moving stage 102b (wafer) along the X direction. The Y mirrors 114b measure the position of the fine moving stage 102b (wafer) along the Y direction.

An X laser interferometer 141a and Y laser interferometer 140a are arranged in the alignment station 120. The X laser interferometer 141a measures the position of the fine moving stage 102a or 102b along the X direction by using the X mirror 113a or 113b. The Y laser interferometer 140a measures the position of the fine moving stage 102a or 102b along the Y direction by using the Y mirror 114a or 114b.

Similarly, an X laser interferometer 141b and Y laser interferometer 140b are arranged in the exposure station 111. The X laser interferometer 141b measures the position of the fine moving stage 102a or 102b along the X direction by using the X mirror 113a or 113b. The Y laser interferometer 140b measures the position of the fine moving stage 102a or 102b along the Y direction by using the Y mirror 114a or 114b.

Temperature sensors 151a and 151b are arranged in the alignment station 120 and exposure station 111, respectively.

The alignment station 120 is provided with a temperature adjusting unit 152a and outlet (blowing port) 150a. The temperature adjusting unit 152a adjusts the temperature in an area 120a to execute the alignment measurement process in the alignment station 120. The measurement processing area 120a includes, e.g., an area which covers an area where the stage 104a or 104b moves for the measurement process.

The exposure station 111 is provided with a temperature adjusting unit 152b and outlet (blowing port) 150b. The temperature adjusting unit 152b adjusts the temperature in an area 111a to execute the exposure process in the exposure station 111. The exposure processing area 111a includes, e.g., an area which covers an area where the stage 104a or 104b moves for the exposure process.

Each of the temperature adjusting units 152a and 152b may include, e.g., a cooler and a heater arranged downstream of the cooler. The cooler may be shared by the temperature adjusting units 152a and 152b. If the alignment station 120 and exposure station 111 align themselves in the Y direction, each of the outlets 150a and 150b is preferably arranged so as to blow temperature-adjusted gas in a direction almost parallel to the X direction perpendicular to the Y direction.

The temperature sensor 151a is arranged so as to measure the temperature in the measurement processing area 120a. The temperature sensor 151b is arranged so as to measure the temperature in the exposure processing area 111a. The temperature measurement results obtained by the temperature sensors 151a and 151b are sent to a temperature adjustment controller 153. On the basis of the temperature measurement result sent from the temperature sensor 151a, the temperature adjustment controller 153 controls the temperature adjusting unit 152a so as to maintain the measurement processing area 120a at a target temperature. Also, on the basis of the temperature measurement result sent from the temperature sensor 151b, the temperature adjustment controller 153 controls the temperature adjusting unit 152b so as to maintain the exposure processing area 111a at the target temperature.

With the above arrangement, the temperatures in the measurement processing area 120a and exposure processing area 111a can be independently adjusted. This makes it possible, e.g., to prevent heat generated by one of the measurement processing area 120a and exposure processing area 111a from influencing the other one. Also, with this arrangement, the alignment measurement process and the exposure process followed by alignment according to the obtained measurement process result can be executed under the same temperature. This makes it possible to prevent variations in dimensions of a wafer, wafer chuck, and stage, and a degradation in alignment accuracy due, e.g., to a variation in temperature of the optical path of a laser interferometer, thus executing the exposure process with high alignment accuracy.

Also, with this arrangement, the direction of the gas blown from the outlet 150a and the direction of the gas blown from the outlet 150b are parallel to each other. This makes it difficult to allow two temperature adjusting systems to interfere with the temperature adjustment of each respective system. Assume here that two temperature adjusting systems interfere with the temperature adjustment of each respective system, and, for example, the temperature adjusting performance of one of these temperature adjusting systems is improved. At this time, that operation may act on the other temperature adjusting system as a disturbance.

In the above-described arrangement, when a temperature (actual temperature) measured by the temperature sensor 151a deviates from a target temperature due to a disturbance during the alignment process, the alignment measurement result may be corrected on the basis of the difference between the measured temperature and the target temperature.

The temperature sensors 151a and 151b are preferably arranged in the measurement processing area 120a and exposure processing area 111a, respectively. However, for example, the temperature sensors 151a and 151b may be arranged near the outlets 150a and 150b, respectively. In this case, the temperatures in the measurement processing area 120a and exposure processing area 111a cannot be directly measured. However, supplying temperature-adjusted gases into the measurement processing area 111a makes it possible to replace the temperature-varied gases naturally produced in these areas with temperature-adjusted gases.

Second Embodiment

This embodiment is different from the first embodiment in the direction in which the temperature adjusting gas is blown. The differences from the first embodiment will be mainly described here. Details which are not particularly referred to here can follow the first embodiment.

Figure 2:
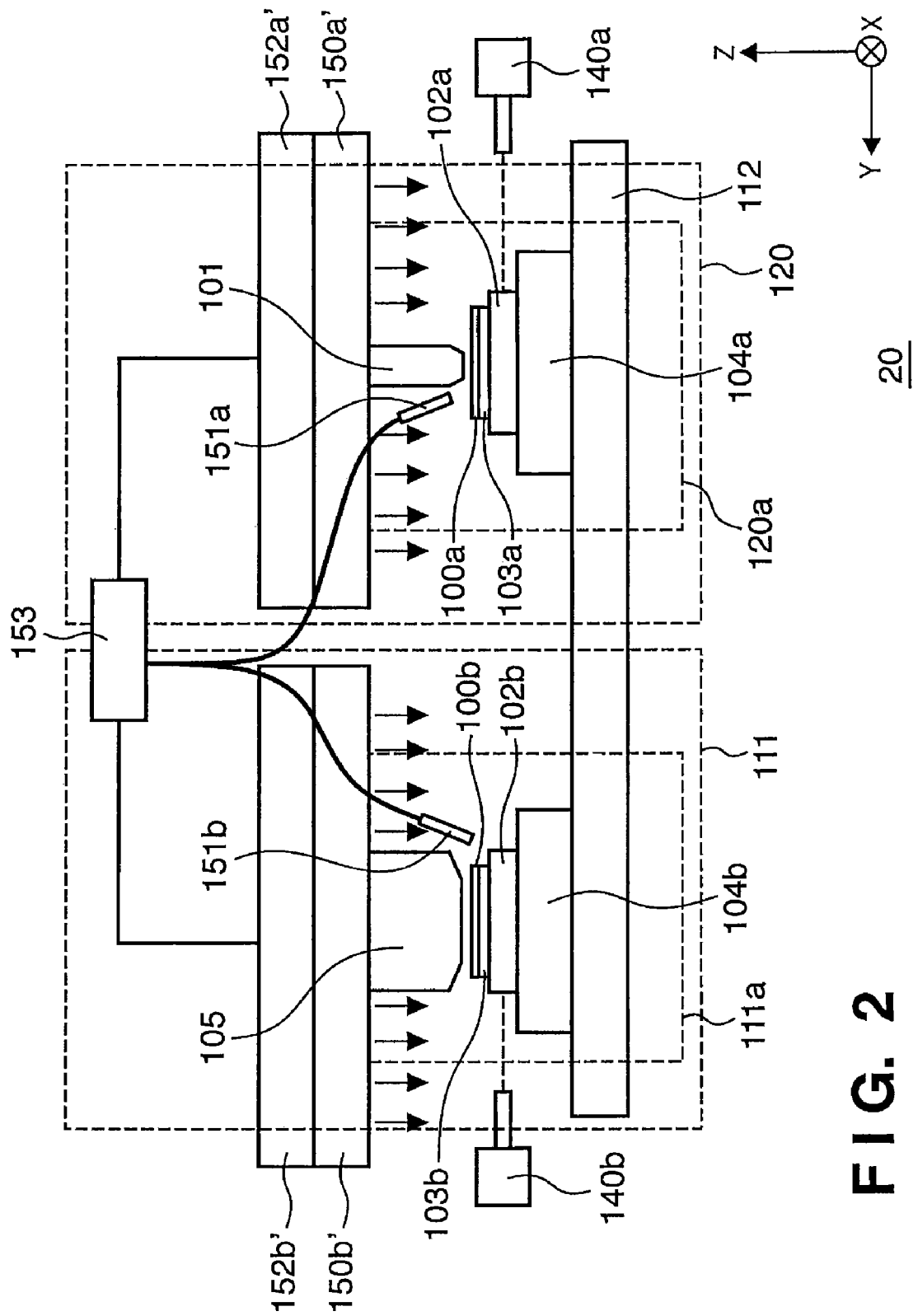
FIG. 2 is a schematic view showing an exposure apparatus according to the second embodiment of the present invention.

FIG. 2 is a side view showing the schematic structure of an exposure apparatus according to the second embodiment of the present invention. An exposure apparatus 20, shown in FIG. 2, comprises an exposure station 111 and an alignment station 120. The exposure station 111 and alignment station 120 share a stage surface plate 112, which provides a reference surface. The exposure apparatus 20 comprises stages 104a and 104b movable in the X and Y directions on the stage surface plate 112. An alignment unit, including an alignment optical system 101, is arranged in the alignment station 120 and executes an alignment measurement process for measuring the position of an alignment mark on a wafer. An exposure unit, including a projection optical system 105, is arranged in the exposure station 111 and transfers the pattern of an original (reticle) onto a photosensitive agent applied to the wafer. In this transfer, the wafer is aligned in accordance with the result of the measurement process executed in the alignment station 120.

The alignment station 120 is provided with a temperature adjusting unit 152a' and outlet 150a'. The temperature adjusting unit 152a' adjusts the temperature in an area 120a to execute the alignment measurement process in the alignment station 120.

The exposure station 111 is provided with a temperature adjusting unit 152b' and outlet 150b'. The temperature adjusting unit 152b' adjusts the temperature in an area 111a to execute the exposure process in the exposure station 111.

Each of the temperature adjusting units 152a' and 152b' includes, e.g., a cooler and a heater arranged downstream of the cooler. The cooler may be shared by the temperature adjusting units 152a' and 152b'. If the alignment station 120 and exposure station 111 align themselves in the Y direction, each of the outlets 150a' and 150b' is preferably arranged so as to blow temperature-adjusted gas in a direction almost parallel to the Z direction (downflow direction) perpendicular to the Y direction.

A temperature sensor 151a is arranged so as to measure the temperature in the measurement processing area 120a. A temperature sensor 151b is arranged so as to measure the temperature in the exposure processing area 111a. The temperature measurement results obtained by the temperature sensors 151a and 151b are sent to a temperature adjustment controller 153. On the basis of the temperature measurement result sent from the temperature sensor 151a, the temperature adjustment controller 153 controls the temperature adjusting unit 152a' so as to maintain the measurement processing area 120a at a target temperature. Also, on the basis of the temperature measurement result sent from the temperature sensor 151b, the temperature adjustment controller 153 controls the temperature adjusting unit 152b' so as to maintain the exposure processing area 111a at the target temperature.

The exposure apparatus 20 according to this embodiment not only brings about an advantage similar to that of the exposure apparatus 10, according to the first embodiment, but also, contributes to a reduction in the footprint by arranging the temperature adjusting device and outlet above the stage base.

Third Embodiment

This embodiment is different from the first and second embodiments in that a unit which forms an air curtain to partition the environments of an alignment station and exposure station is provided. The differences from the first and second embodiments will be mainly described here. Details, which are not particularly referred to here, can follow the first and second embodiments.

Figure 3:
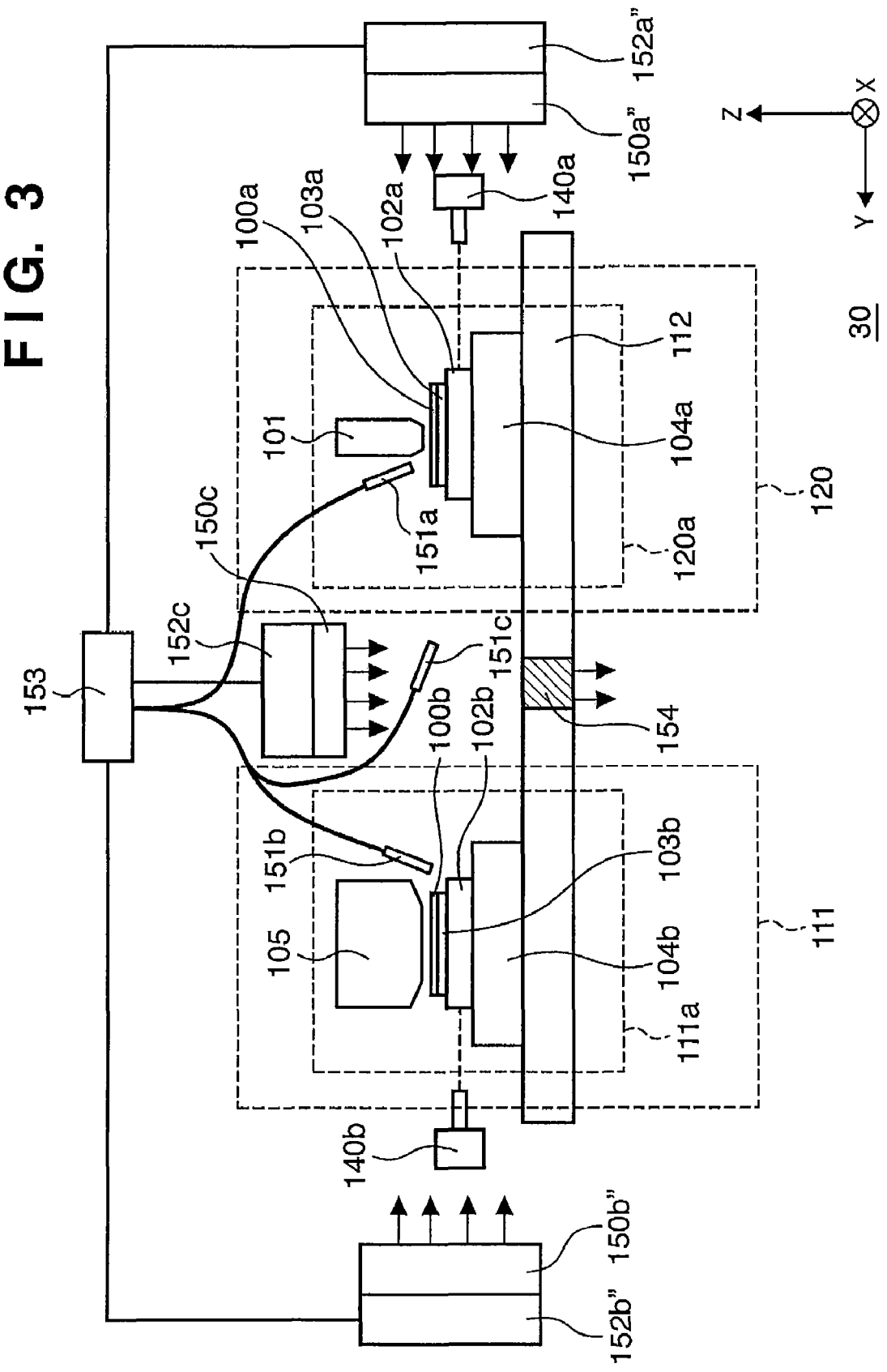
FIG. 3 is a schematic view showing an exposure apparatus according to the third embodiment of the present invention.

FIG. 3 is a side view showing the schematic structure of an exposure apparatus according to the third embodiment of the present invention. An exposure apparatus 30, shown in FIG. 3, comprises an exposure station 111 and an alignment station 120. The exposure station 111 and alignment station 120 share a stage surface plate 112, which provides a reference plane. The exposure apparatus 30 comprises stages 104a and 104b movable in the X and Y directions on the stage surface plate 112. An alignment unit, including an alignment optical system 101, is arranged in the alignment station 120 and executes an alignment measurement process for measuring the position of an alignment mark on a wafer. An exposure unit, including a projection optical system 105, is arranged in the exposure station 111 and transfers the pattern of an original (reticle) onto a photosensitive agent applied to the wafer. In this transfer, the wafer is aligned in accordance with the result of the measurement process executed in the alignment station 120.

The alignment station 120 is provided with a temperature adjusting unit 152a" and outlet 150a". The temperature adjusting unit 152a" adjusts the temperature in an area 120a to execute the alignment measurement process in the alignment station 120.

The exposure station 111 is provided with a temperature adjusting unit 152b" and outlet 150b". The temperature adjusting unit 152b" adjusts the temperature in an area 111a to execute the exposure process in the exposure station 111.

Each of the temperature adjusting units 152a" and 152b" includes, e.g., a cooler and a heater arranged downstream of the cooler. The cooler may be shared by the temperature adjusting units 152a" and 152b". The direction of gases blown from outlets 150a" and 150b" are not particularly limited. In the example shown in FIG. 3, the outlets 150a" and 150b" are arranged so as to blow gases in the directions in which they face each other. The outlets 150a" and 150b" may blow gases in the direction shown in the first or second embodiment, or in another direction.

The exposure apparatus 30 according to this embodiment comprises an air curtain unit, which forms an air curtain to partition the environments of the alignment station 120 and exposure station 111. The air curtain unit includes an outlet (blowing port) 150c, which forms an air curtain between the alignment station 120 and the exposure station 111 by utilizing the gas flow in the vertical direction (Z direction). At this time, the vertical direction can be either downward (in this case, a downflow is formed) or upward. However, the vertically downward direction is preferable.

The air curtain unit preferably includes a temperature adjusting unit 152c and causes it to supply temperature-adjusted gas to the outlet 150c. The temperature adjusting unit 152c can preferably be controlled by a temperature adjusting controller 153 to supply, to the outlet 150c, gas, whose temperature is adjusted to be equal to a target temperature in the exposure processing area 111a and measurement processing area 120a. At this time, the temperature adjustment controller 153 preferably controls the temperature adjusting unit 152c on the basis of the temperature measurement result sent from a temperature sensor 151c, which measures the temperature of gas blown from the outlet 150c.

The air curtain unit preferably further includes a suction port 154 to draw gas by suction. This makes it possible to prevent gases blown from the outlets 150a", 150b", and 150c from forming turbulence. When a downflow is to be formed using the air curtain unit, the suction port 154 may be prepared for, e.g., the stage base 112.

As described above, forming an air curtain to partition the environments of the alignment station 120 and exposure station 111 makes it possible to independently control the temperatures of the alignment station 120 and exposure station 111. It is also possible to increase the degrees of freedom of the direction in which gases are supplied, so as to adjust the temperatures in the measurement processing area 120a and exposure processing area 111a.

APPLICATION EXAMPLE

Figure 4:
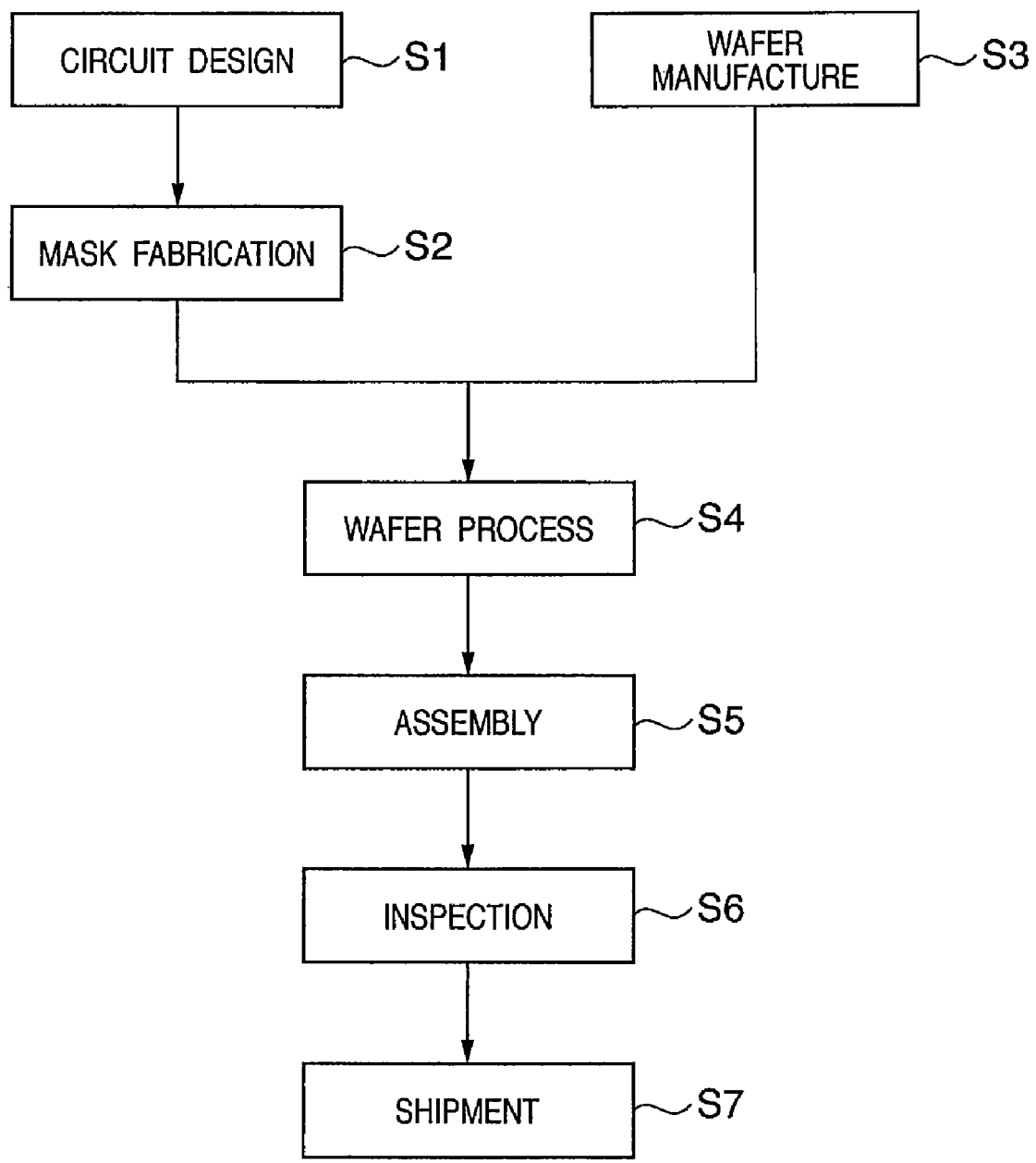
FIG. 4 is a flowchart for explaining the device manufacture using an exposure apparatus according to the present invention.

An embodiment of a device manufacturing method using the above-described exposure apparatus will be described next with reference to FIGS. 4 and 5. FIG. 4 is a flowchart for explaining the manufacture of a device (e.g., a semiconductor chip, such as an IC or LSI, an LCD, or a CCD). A semiconductor chip manufacturing method will be exemplified here.

In Step S1 (circuit design), the circuit of a semiconductor device is designed. In step S2 (mask fabrication), a mask is fabricated on the basis of the designed circuit pattern. In step S3 (wafer manufacture), a wafer is manufactured using a material such as silicon. In step S4 (wafer process), called a pre-process, the above-described exposure apparatus is caused to form an actual circuit on the wafer by lithography using the mask and wafer. In step S5 (assembly), called a post-process, a semiconductor chip is formed using the wafer manufactured in step S4. This step includes an assembly step (dicing and bonding) and a packaging step (chip encapsulation). In step S6 (inspection), the semiconductor device manufactured in step S5 undergoes inspections, such as an operation confirmation test and a durability test. After these steps, the semiconductor device is completed and shipped (step S7).

Figure 5:
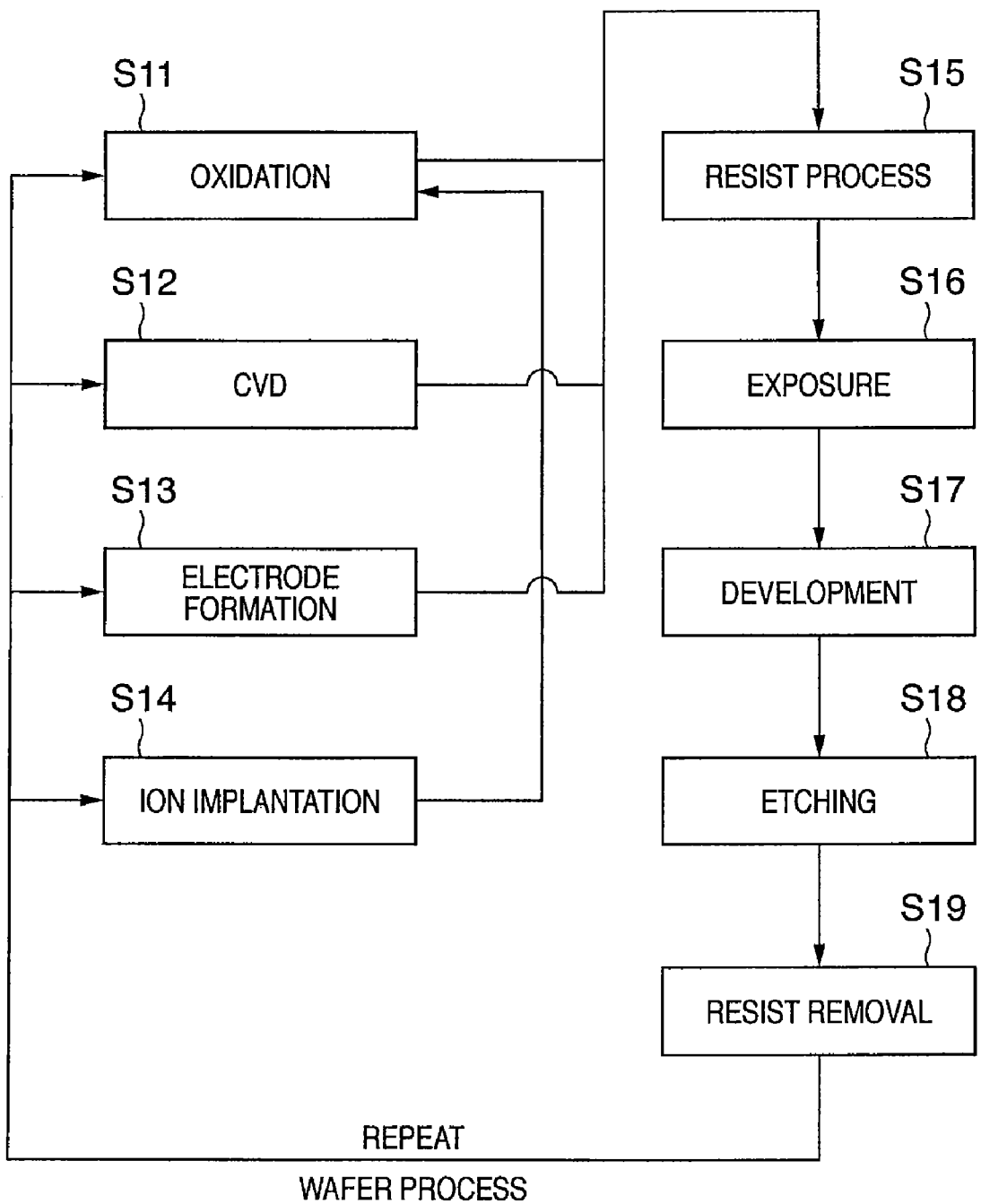
FIG. 5 is a flowchart showing details of the wafer process in step S4 of the flowchart shown in FIG. 4.

FIG. 5 is a flowchart showing details of the wafer process in step S4. In step S11 (oxidation), the wafer surface is oxidized. In step S12 (CVD), an insulating film is formed on the wafer surface. In step S13 (electrode formation), an electrode is formed on the wafer by vapor deposition. In step S14 (ion implantation), ions are implanted in the wafer. In step S15 (resist process), a photosensitive agent is applied to the wafer. In step S16 (exposure), the exposure apparatus is caused to transfer the mask circuit pattern onto the photosensitive agent on the wafer to form a latent image pattern on the photosensitive agent. In step S17 (development), the latent image pattern formed on the photosensitive agent on the wafer is developed to form a patterned resist mask. In step S18 (etching), portions other than the developed resist image are etched. In step S19 (resist removal), any unnecessary resist remaining after etching is removed. These steps are repeated to form multiple circuit patterns on the wafer.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. An exposure apparatus which includes an alignment station where an alignment measurement process is executed, an exposure station where an exposure process is executed, and two stages, which can be swapped between said alignment station and said exposure station, the apparatus comprising:

a first blowing unit which blows temperature-adjusted gas toward said alignment station;

a second blowing unit which blows temperature-adjusted gas toward said exposure station; and an air curtain unit which forms an air curtain between said alignment station and said exposure station, wherein said air curtain unit includes a third blowing unit which is arranged between said alignment station and said exposure station and blows gas so as to form an air curtain to partition said alignment station and said exposure station, and a third temperature adjusting unit which supplies temperature-adjusted gas to said third blowing unit.

2. The apparatus according to claim 1, wherein said third blowing unit ejects gas substantially vertically downward to form a downflow.

3. The apparatus according to claim 1, wherein directions in which said first blowing unit and said second blowing unit blow the gases are substantially perpendicular to a direction along which said alignment station and said exposure station are arranged.

4. The apparatus according to claim 1, further comprising:
a first temperature sensor which measures a temperature of the gas blown from said first blowing unit;
a second temperature sensor which measures a temperature of the gas blown from said second blowing unit;
a first temperature adjusting unit which supplies, to said first blowing unit, the gas that is temperature-adjusted in accordance with a temperature measurement result sent from said first temperature sensor; and
a second temperature adjusting unit which supplies, to said second blowing unit, the gas that is temperature-adjusted in accordance with a temperature measurement result sent from said second temperature sensor.

5. The apparatus according to claim 1, wherein the directions in which said first blowing unit and said second blowing unit blow the gases are a substantially horizontal direction.

6. The apparatus according to claim 1, wherein the directions in which said first blowing unit and said second blowing unit blow the gases are a substantially vertical direction.

7. An exposure apparatus which includes an alignment station where an alignment measurement process is executed, an exposure station where an exposure process is executed, and two stages, which can be swapped between said alignment station and said exposure station, the apparatus comprising:
a first blowing unit which blows temperature-adjusted gas toward said alignment station;
a second blowing unit which blows temperature-adjusted gas toward said exposure station; and
an air curtain unit which forms an air curtain between said alignment station and said exposure station,
wherein said air curtain unit includes a third blowing unit which is arranged between said alignment station and said exposure station and blows gas so as to form an air curtain to partition said alignment station and said exposure station, and a suction unit which draws gas by suction.

8. The apparatus according to claim 7, wherein said third blowing unit ejects gas substantially vertically downward to form a downflow.

9. The apparatus according to claim 7, wherein directions in which said first blowing unit and said second blowing unit blow the gases are substantially perpendicular to a direction along which said alignment station and said exposure station are arranged.

10. The apparatus according to claim 7, further comprising:
a first temperature sensor which measures a temperature of the gas blown from said first blowing unit;
a second temperature sensor which measures a temperature of the gas blown from said second blowing unit;
a first temperature adjusting unit which supplies, to said first blowing unit, the gas that is temperature-adjusted in accordance with a temperature measurement result sent from said first temperature sensor; and
a second temperature adjusting unit which supplies, to said second blowing unit, the gas that is temperature-adjusted in accordance with a temperature measurement result sent from said second temperature sensor.

11. The apparatus according to claim 7, wherein the directions in which said first blowing unit and said second blowing unit blow the gases are a substantially horizontal direction.

12. The apparatus according to claim 7, wherein the directions in which said first blowing unit and said second blowing unit blow the gases are a substantially vertical direction.

13. A device manufacturing method comprising steps of:
(a) causing an exposure apparatus to form a latent image pattern on a photosensitive agent applied to a substrate; and
(b) developing the latent image pattern to manufacture a device,
wherein the exposure apparatus includes:
(i) an alignment station where an alignment measurement process is executed;
(ii) an exposure station where an exposure process is executed;
(iii) two stages which can be swapped between the alignment station and the exposure station;
(iv) a first blowing unit which blows temperature-adjusted gas toward the alignment station;
(v) a second blowing unit which blows temperature-adjusted gas toward the exposure station; and
(vi) an air curtain unit which forms an air curtain between the alignment station and the exposure station,
wherein the air curtain unit includes a third blowing unit which is arranged between the alignment station and the exposure station and blows gas so as to form an air curtain to partition the alignment station and the exposure station, and a third temperature adjusting unit which supplies temperature-adjusted gas to the third blowing unit.

14. A device manufacturing method comprising steps of:
(a) causing an exposure apparatus to form a latent image pattern on a photosensitive agent applied to a substrate; and
(b) developing the latent image pattern to manufacture a device,
wherein the exposure apparatus includes:
(i) an alignment station where an alignment measurement process is executed;
(ii) an exposure station where an exposure process is executed;
(iii) two stages which can be swapped between the alignment station and the exposure station;
(iv) a first blowing unit which blows temperature-adjusted gas toward the alignment station;
(v) a second blowing unit which blows temperature-adjusted gas toward the exposure station; and
(vi) an air curtain unit which forms an air curtain between the alignment station and the exposure station,
wherein the air curtain unit includes a third blowing unit which is arranged between the alignment station and the exposure station and blows gas so as to form an air curtain to partition the alignment station and the exposure station, and a suction unit which draws gas by suction.

* * * * *